(12) United States Patent
Ono et al.

(10) Patent No.: US 7,933,128 B2
(45) Date of Patent: Apr. 26, 2011

(54) ELECTRONIC DEVICE, ELECTRONIC MODULE, AND METHODS FOR MANUFACTURING THE SAME

(75) Inventors: Atsushi Ono, Shiojiri (JP); Yoshihiro Kobayashi, Komagane (JP); Shojiro Kitamura, Suwa-gun (JP); Masayuki Matsunaga, Minowa-machi (JP); Akitoshi Hara, Suwa-gun (JP)

(73) Assignee: Epson Toyocom Corporation, Tokyo (JP)

( * ) Notice: Subject to any disclaimer, the term of this patent is extended or adjusted under 35 U.S.C. 154(b) by 376 days.

(21) Appl. No.: 12/248,395

(22) Filed: Oct. 9, 2008

(65) Prior Publication Data
US 2009/0095510 A1    Apr. 16, 2009

(30) Foreign Application Priority Data

Oct. 10, 2007 (JP) ................. 2007-264443
Mar. 3, 2008 (JP) ................. 2008-052277

(51) Int. Cl.
*H05K 1/18* (2006.01)
(52) U.S. Cl. ........ 361/761; 361/736; 361/748; 361/767; 361/785; 361/788; 174/254; 174/261
(58) Field of Classification Search .......... 174/254, 174/250, 255, 260, 261, 557; 361/728, 736, 361/748, 760, 761, 762, 767, 783, 785, 788, 361/790, 792, 679.01, 752, 764, 820, 784; 29/846, 832
See application file for complete search history.

(56) References Cited

U.S. PATENT DOCUMENTS

| | | | | |
|---|---|---|---|---|
| 5,579,207 A | * | 11/1996 | Hayden et al. | 361/790 |
| 7,429,787 B2 | * | 9/2008 | Karnezos et al. | 257/686 |
| 7,505,276 B2 | * | 3/2009 | Dangelmaier | 361/735 |
| 2004/0211590 A1 | * | 10/2004 | Tagi et al. | 174/255 |
| 2007/0289127 A1 | * | 12/2007 | Hurwitz et al. | 29/827 |

FOREIGN PATENT DOCUMENTS

| | | |
|---|---|---|
| JP | A-10-253652 | 9/1998 |
| JP | A-11-307673 | 11/1999 |

(Continued)

*Primary Examiner* — Dameon E Levi
*Assistant Examiner* — Hoa C Nguyen
(74) *Attorney, Agent, or Firm* — Oliff & Berridge PLC

(57) ABSTRACT

An electronic device includes: an outline configuration including a first surface, a second surface facing opposite from the first surface, and a mounting surface coupled to the first and second surfaces; a first substrate including a first electrode; a second substrate including a second electrode; a resin disposed between the first and second substrates; and an electric element sealed with the resin and having an outline configuration of a polyhedron, the electric element being disposed such that a broadest surface of the polyhedron faces one of the first substrate and the second substrate. The first surface is one surface of the first substrate, the one surface being opposite from another surface of the first substrate on a side adjacent to the resin. The second surface is one surface of the second substrate, the one surface being opposite from another surface of the second substrate on a side adjacent to the resin. The mounting surface includes: an exposed surface of the resin between the first and second substrates, and side surfaces of the first and second substrates adjacent to the exposed surface. The first electrode is disposed at an end of the first surface adjacent to the mounting surface and electrically coupled to the electric element. The second electrode is disposed at an end of the second surface adjacent to the mounting surface and electrically coupled to the electric element.

16 Claims, 13 Drawing Sheets

FOREIGN PATENT DOCUMENTS

| | | |
|---|---|---|
| JP | A-2004-361175 | 12/2004 |
| JP | A-2006-078250 | 3/2006 |
| JP | A-2006-203086 | 8/2006 |
| JP | A-2008-051628 | 3/2008 |
| JP | A-2008-051629 | 3/2008 |

* cited by examiner

ELECTRONIC DEVICE, ELECTRONIC MODULE, AND METHODS FOR MANUFACTURING THE SAME

BACKGROUND

1. Technical Field

The present invention relates to an electronic device, an electronic module, and their fabrication methods.

2. Related Art

Sensor elements such as acceleration sensors, gyro sensors, and inertial sensors contain a shaft for performing sensing. In some cases, these elements are packaged vertically even if they are horizontally formed. It is also necessary that they be set upright accurately. JP-A-10-253652 discloses a technique for vertically packaging a horizontally positioned element by use of a lead frame. However, it is difficult to precisely set the element upright with easily bendable leads. Also, because the leads are flexed after being connected by wire bonding, such connection is not very reliable. JP-A-2004-361175 discloses a technique in which terminals are inserted into a circuit board and soldered by a dip method. However, it is also difficult to precisely set the element upright. These problems are likely to occur to any electronic devices having elements that need be accurately set upright.

SUMMARY

An advantage of the invention is to provide an electronic device and an electronic module having an element set accurately upright, and fabrication methods therefore.

According to a first aspect of the invention, an electronic device includes: an outline configuration including a first surface, a second surface facing opposite from the first surface, and a mounting surface coupled to the first and second surfaces; a first substrate including a first electrode; a second substrate including a second electrode; a resin disposed between the first and second substrates; and an electric element sealed with the resin and having an outline configuration of a polyhedron, the electric element being disposed such that a broadest surface of the polyhedron faces one of the first substrate and the second substrate, in that: the first surface is one surface of the first substrate, the one surface being opposite from another surface of the first substrate on a side adjacent to the resin; the second surface is one surface of the second substrate, the one surface being opposite from another surface of the second substrate on a side adjacent to the resin; the mounting surface includes an exposed surface of the resin between the first and second substrates, and side surfaces of the first and second substrates adjacent to the exposed surface; the first electrode is disposed at an end of the first surface adjacent to the mounting surface and electrically coupled to the electric element; and the second electrode is disposed at an end of the second surface adjacent to the mounting surface and electrically coupled to the electric element. In this aspect of the invention, the first and second electrodes are provided to the respective first and second surfaces of the electronic device. Because each of these electrodes is disposed at the end adjacent to the respective mounting surface, it is possible to electrically couple these electrodes to the electric element even if the element is disposed with its mounting surface facing downward. Accordingly, it becomes possible to package the element upright (vertically) by disposing the element with the mounting surface facing downward, even if the broadest surface of the element is facing the first or the second substrate (even if the element is positioned horizontally).

With the electronic device, it is preferable that each of the first and second electrodes include a portion constituting part of the mounting surface.

With the electronic device, it is preferable that the first electrode be disposed from a periphery of the first surface with an interval, and that the second electrode be disposed from a periphery of the second surface with an interval.

With the electronic device, it is preferable that the first electrode be disposed on the first surface adjacent to the mounting surface, and that the second electrode be disposed on the second surface adjacent to the mounting surface.

With the electronic device, it is preferable that each of the first and second electrodes include a side surface electrode portion reaching to the side surface of each of the respective first and second substrates.

With the electronic device, it is preferable that the first and second electrodes be disposed only on the respective first and second surfaces while avoiding the side surface of the respective first and second substrates.

With the electronic device, it is preferable that the first and second surfaces be in parallel with each other, and that the first and second electrodes be positioned plane-symmetrically to each other using, as a reference plane, a plane located in parallel to and halfway between the first and second surfaces.

With the electronic device, it is preferable that the first and second electrodes have an identical surface configuration.

With the electronic device, it is preferable that the second electrode be electrically insulated from the electric element.

With the electronic device, it is preferable that the second electrode be electrically coupled to the electric element.

With the electronic device, it is preferable that the electric element be an inertial sensor element.

According to a second aspect of the invention, an electronic module includes the electronic device according to the first aspect of the invention and a circuit board including a first interconnection and a second interconnection, in that: the electronic device is mounted above the circuit board with the mounting surface facing the circuit board; and the first and second electrodes are connected to the respective first and second interconnections by a brazing material. In this aspect of the invention, the first and second electrodes are provided to the respective first and second surfaces of the electronic device. Because each of these electrodes is disposed at the end adjacent to the respective mounting surface, it is possible to electrically couple these electrodes to the electric element even if the element is disposed with its mounting surface facing downward. Accordingly, it becomes possible to package the element upright (vertically) by disposing the element with the mounting surface facing downward, even if the broadest surface of the element is facing the first or the second substrate (even if the element is positioned horizontally).

According to a third aspect of the invention, a method for fabricating an electronic device which includes an outline configuration having a first surface, a second surface facing opposite from the first surface, and a mounting surface coupled to the first and second surfaces, the method includes: (a) disposing an electric element having an outline configuration of a polyhedron between a first substrate having a first electrode and a second substrate having a second electrode, in a manner that a broadest surface of the polyhedron faces one of the first substrate and the second substrate and electrically couples the first electrode to the electric element, (b) sealing the electric element between the first and second substrates with a resin, and (e) dicing the first and second substrates and the resin integrally such that the diced surface becomes flat, in that: the first surface is made of a part of one surface of the first substrate, the one surface being opposite from another surface of the first substrate on a side adjacent to the resin; the second surface is made of a part of one surface of the second substrate, the one surface being opposite from another surface of the first substrate on a side adjacent to the resin; the mounting surface is composed of an exposed surface of the resin made as a result of dicing the resin and side surfaces of the first and second substrates made as a result of dicing the first and second substrates; the first substrate is diced such that the first electrode is disposed on an end of the first surface adjacent to the mounting surface; and the second substrate is diced such that the second electrode is disposed on an end of the second surface adjacent to the mounting surface. According to the electronic device fabricated in accordance with this aspect of the invention, the first and second electrodes are provided to the respective first and second surfaces of the electronic device. Because each of these electrodes is disposed at the end adjacent to the respective mounting surface, it is possible to electrically couple these electrodes to the electric element even if the element is disposed with its mounting surface facing downward. Accordingly, it becomes possible to package the element upright (vertically) by disposing the element with the mounting surface facing downward, even if the broadest surface of the element is facing the first or the second substrate (even if the element is positioned horizontally).

In this method, it is preferable that: the first substrate be diced at a position at which the first electrode is diced, so that the first electrode is disposed on the first surface adjacent to the mounting surface; and the second substrate be diced at a position at which the second electrode is diced, so that the second electrode is disposed on the second surface adjacent to the mounting surface.

In this method, it is preferable that the first substrate be diced while avoiding the first electrode so that the first electrode is disposed from a periphery of the first surface with an interval, and that the second substrate be diced while avoiding the second electrode so that the second electrode is disposed from a periphery of the second surface with an interval.

According to a fourth aspect of the invention, a method for fabricating an electronic module includes: (a) preparing the electronic device as described hereinbefore, the electronic device including a plurality of the first electrodes and a plurality of the second electrodes, (b) preparing a circuit board including a plurality of first lands and a plurality of second lands, (c) mounting the electronic device above the mounting surface with the mounting surface facing the circuit board and bonding the plurality of first and second electrodes to the plurality of first and second lands using a brazing material, in that: the first and second surfaces of the electronic device are in parallel with each other, and the plurality of first and second electrodes are positioned plane-symmetrically to each other using, as a reference plane, a plane located in parallel to and halfway between the first and second surfaces; the plurality of first and second lands are aligned line-symmetrically to each other; and the electronic device is positioned against the circuit board utilizing a self-alignment effect exerted in the braze-bonding in step (c).

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
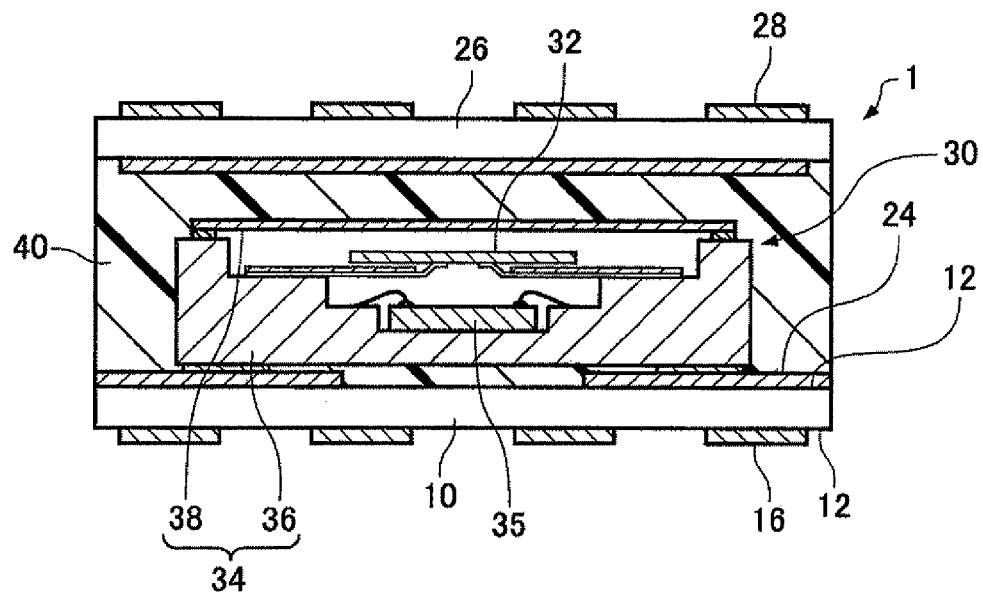
FIG. 1 is a sectional diagram taken on a line I-I of an electronic device illustrated in FIG. 3A.
Figure 2:
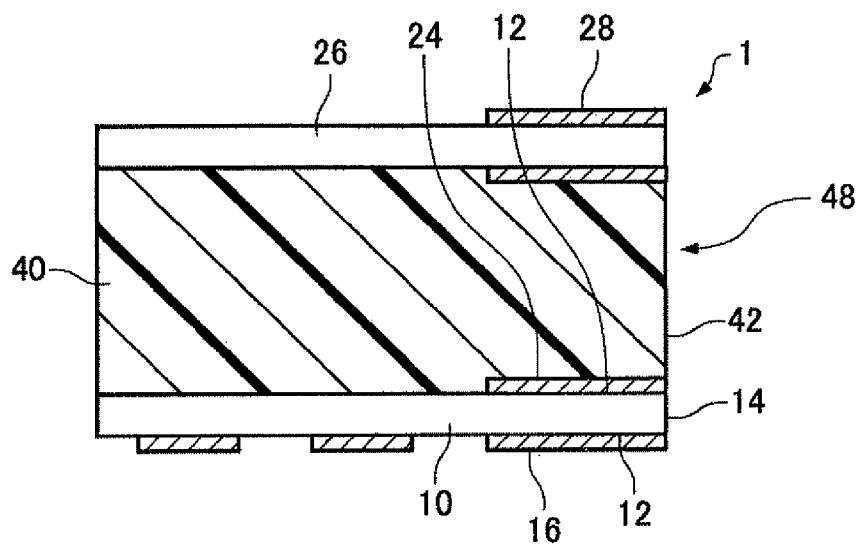
FIG. 2 is a sectional diagram taken on a line II-II of the electronic device illustrated in FIG. 3A.
Figure 3A:
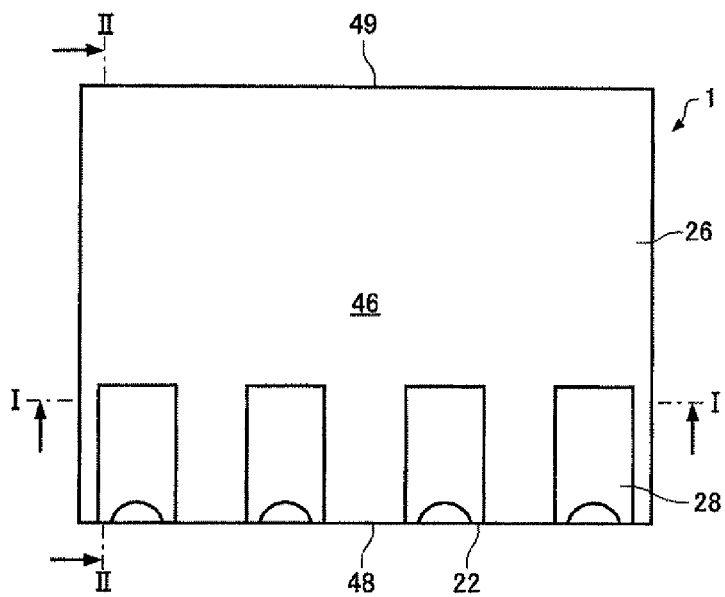
FIG. 3A is a planar diagram of the electronic device according to one embodiment of the invention.
Figure 3B:
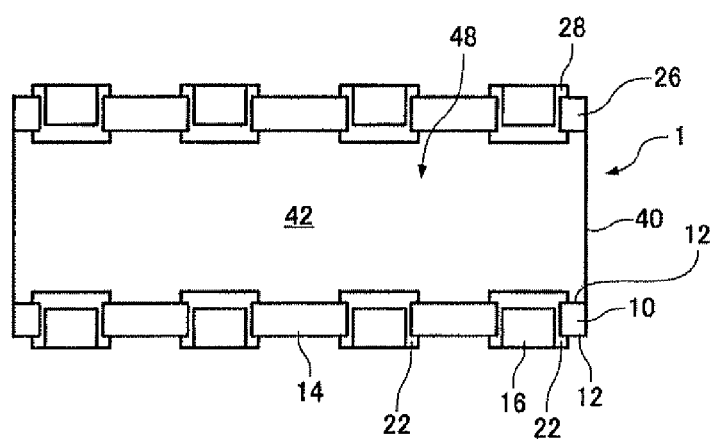
FIG. 3B is a side surface diagram of the electronic device according to the embodiment of the invention.
Figure 3C:
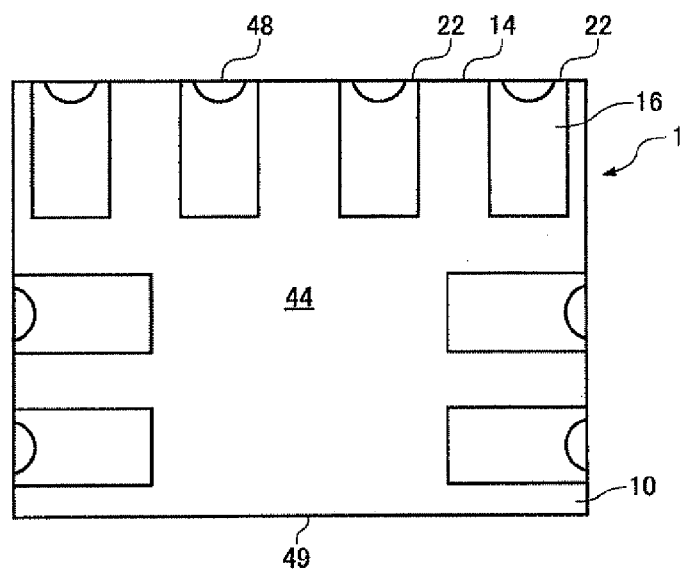
FIG. 3C is a bottom surface diagram of the electronic device according to the embodiment of the invention.

FIGS. 1 and 2 are both sectional diagrams of an electronic device 1 according to one embodiment of the invention. FIGS. 3A through 3C are, respectively, a planar diagram, a side surface diagram, and a bottom surface diagram of the electronic device 1 according to the embodiment of the invention. FIG. 1 is a section taken on a line I-I of the electronic device shown in FIG. 3A, and FIG. 2 is a section taken on a line II-II of the electronic device shown in FIG. 3A.

The electronic device 1 includes a first substrate 10. The first substrate 10 is made of such a material as: a mixture material of an organic material and an inorganic material such as glass epoxy, an organic material such as resin, a metal such as an iron-based material (including 42 alloy which is an alloy made of iron containing nickel by 42%) or a copper-based material, or an inorganic material such as ceramic or glass. A lead frame for framing a semiconductor device may be used as the first substrate 10. The first substrate 10 includes two surfaces 12 facing opposite from each other and a side surface 14 defining thickness. The two surfaces 12 are in parallel with each other (meaning that the thickness is uniform), and the side surface 14 is orthogonal to the two surfaces 12.

Figure 4:
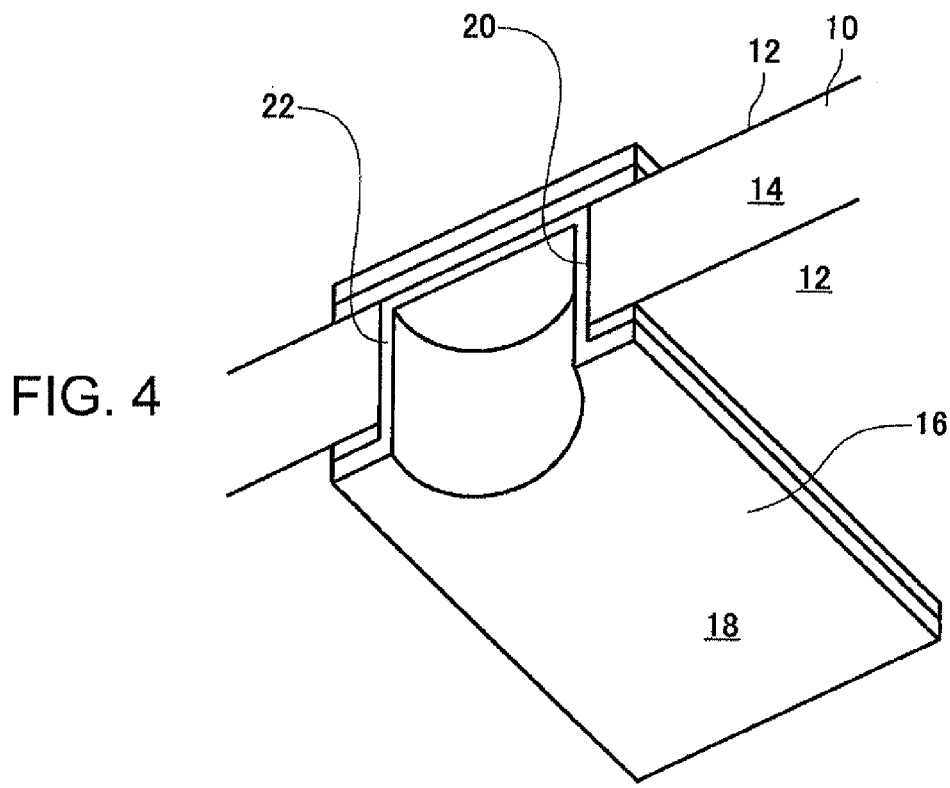
FIG. 4 is an enlarged perspective diagram showing details of a first electrode and its surroundings.

The first substrate 10 has one or more first electrodes 16. FIG. 4 is an enlarged perspective diagram showing details of one of the first electrodes 16 and its surroundings. The first electrode 16 includes a surface electrode portion 18 which is provided to one surface (lower surface in FIG. 1) of the first substrate 10. A surface (lower surface in FIG. 4) of this surface electrode portion 18 and a side surface (defining thickness) of this portion 18 as well as a surface of the first substrate 10 together form a step. As an alternative example, a surface of the first electrode 16 and the surface of the first substrate 10 may share the same surface. A cutout section 20 (a recess when seen from the side surface 14) is provided to an edge of the first substrate 10. The cutout section 20 may have a curved inner surface (for example, an inner wall surface of part of a circular through hole, i.e. less than half a circle) or may be composed of a plurality of flat surfaces. The first electrode 16 is made to reach to the side surface 14 (to the inner surface of the cutout section 20). That is, the first electrode 16 has a side surface electrode portion 22 on the inner surface of the cutout section 20. The side surface electrode portion 22 does not protrude from the side surface 14 (i.e. from a part of the side surface 14 adjacent to the cutout section 20) of the first substrate 10 and includes: a part sharing the same surface with the side surface 14, and a part recessed from the side surface 14. The first substrate 10 has a patterned interconnection 24. The patterned interconnection 24 is provided to a surface of the first substrate 10 opposite from the surface of the substrate 10 having the first electrode 16. The patterned interconnection 24 and the first electrode 16 are electrically coupled to each other, with the side surface electrode portion 22 interposed therebetween.

Figure 5:
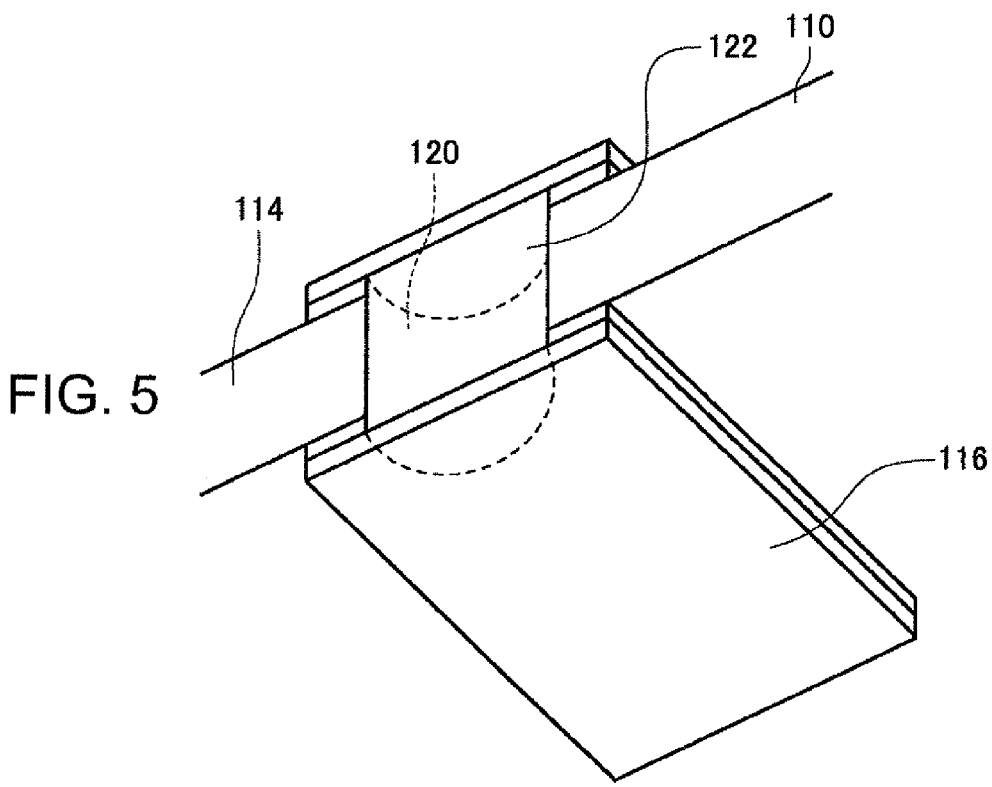
FIG. 5 is an enlarged perspective diagram showing an alternative example of details of the first electrode and its surroundings.

As an alternative example, with reference to FIG. 5, an entire side surface electrode portion 122 of a first electrode 116 may share the same surface as a side surface 114 (a part adjacent to a cutout section 120) of a first substrate 110.

The electronic device 1 includes a second substrate 26. The second substrate 26 includes one or more second electrodes 28. As to the compositions of the second substrate 26 and each of the second electrodes 28, the aforementioned compositions of the first substrate 10 and the first electrode 16 will apply. However, the second electrode 28 differs from the first electrode 16 in that the second electrode 28 may be a dummy electrode which is electrically decoupled and insulated from an electric element 30. The first substrate 10 having the plurality of first electrodes 16 and the second substrate 26 having the plurality of second electrodes 28 may have an identical structure. The first and second substrates 10, 26 are disposed apart from each other such that the first and second electrodes 16, 28 face opposite from each other. The first electrodes 16 may be arranged plane-symmetrically to the second electrodes 28. In this regard, it is also possible to provide the electrodes to the first substrate 10 as illustrated in FIG. 3C, so long as the plurality of first electrodes 16 lined along one side of the first substrate 10 are disposed plane-symmetrically to the plurality of second electrodes 28 lined along one side of the second substrate 26. Additionally, the electrodes 16, 28 have the same surface configuration (at least at their surface electrode portions 18).

The electronic device 1 includes the electric element 30. The electric element 30 has an element piece 32 (e.g. a piezoelectric resonator element) and a package 34 (made of e.g. ceramic) for sealing the element piece 32. An IC 35 may also be sealed. In the example of FIG. 1, the package 34 includes a lid 38 and a base 36 which is fixed to the first substrate 10. The electric element 30 is an inertial sensor such as an acceleration sensor for determining linear acceleration or a gyro sensor for determining angular velocity. The inertial sensor has azimuth dependency. For example, the acceleration sensor detects acceleration velocity in the direction of a detection shaft, and the gyro sensor detects angular velocity around a rotary shaft. In order to function properly, the electric element 30 needs be positioned with the shaft directed in a precise direction. The electric element 30 is therefore disposed such that its broadest surface having an outline configuration of a polyhedron faces the first substrate 10 or the second substrate 26. Also, the element piece 32 is precisely disposed relative to the outline of the electric element 30 (the outline of the package 34). Specifically, for example, the element piece 32 of an acceleration sensor is disposed such that the detection shaft of the piece 32 lies in parallel with the broadest surface of the electric element 30, and the element piece 32 of a gyro sensor is disposed such that the rotary detection shaft of the piece 32 is orthogonal to the broadest surface of the electric element 30. The electric element 30 is electrically coupled to the first electrodes 16. Terminals of the element 30 are electrically coupled to the patterned interconnection 24 of the first substrate 10. With reference to FIG. 1, the terminals of the element 30 and the patterned interconnection 24 may face each other or may not face each other (may face the same direction). In the case of the latter, the element 30 and the interconnection 24 may be electrically coupled by wires. The second electrodes 28 may be electrically decoupled and insulated from an electric element 30, or they may be electrically coupled to the element 30.

The electronic device 1 includes a resin 40 disposed between the first and second substrates 10, 26. The electric element 30 is sealed with the resin 40. The resin 40 is electrically insulating. The first substrate 10 and the second substrate 26 are adhered to each other with the resin 40. The resin 40 adheres to a surface of the first substrate 10 opposite from the surface having the first electrodes 16 and to a surface of the second substrate 26 opposite from the surface having the second electrodes 28, and does not come in contact with the remaining surfaces of the first and second substrates 10, 26 (nor with the first and second electrodes 16, 28, nor with the side-surface electric portions 22). The resin 40 is exposed between the first and second substrates 10, 26. This exposed surface 42 is orthogonal to the two surfaces 12 of the first and second substrates 10, 26 (is in parallel to the side surfaces 14 of the first and second substrates 10, 26). Additionally, the exposed surface 42 of the resin 40 shares the same surface with the side surfaces 14 of the first and second substrates 10, 26

The electronic device 1 has an outline configuration including: a first surface 44 and a second surface 46 facing opposite from each other, and a mounting surface 48 connected to the first and second surfaces 44, 46. The first surface 44 is the surface of the first substrate 10 opposite from the surface on the side adjacent to the resin 40. The second surface 46 is the surface of the second substrate 26 opposite from the surface on the side adjacent to the resin 40. The mounting surface 48 includes: the exposed surface 42 of the resin 40 between the first and second substrates 10, 26, and the side surfaces 14 of the first and second substrates 10, 26 adjacent to the exposed surface 42. The mounting surface 48 is a flat surface. The mounting surface 48 is a bottom surface at the time of mounting. An upper-end mounting surface 49 opposite from the mounting surface 48 is also a flat surface.

The first electrodes 16 are disposed next to each other on an end of the first surface 44 adjacent to the mounting surface 48. The second electrodes 28 are disposed next to each other on an end of the second surface 46 adjacent to the mounting surface 48. Each of the first and second electrodes 16, 28 has the portion (the side surface electrode portion 22) constituting a part of the mounting surface 48. The first and second surfaces 44, 46 are in parallel with each other. At least one first electrode 16 is disposed plane-symmetrically to at least one second electrode 28 with respect to the first surface 44 or the second surface 46, using, as a reference plane, a plane (not shown) in parallel to the first and second surfaces 44, 46.

Figure 6:
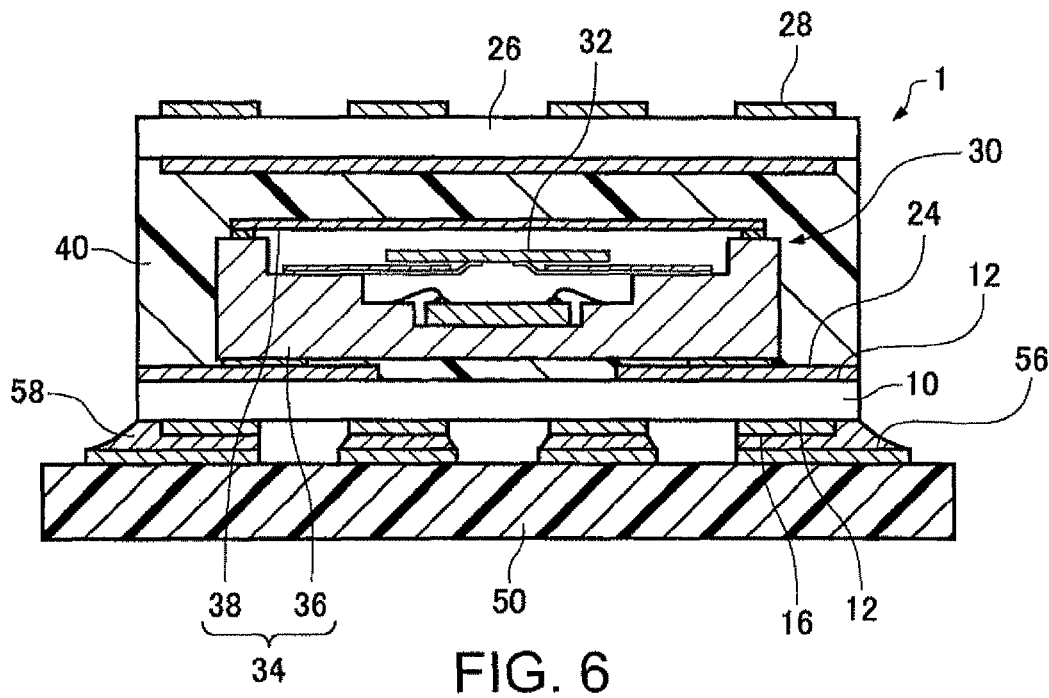
FIG. 6 is a sectional diagram showing a mounting example of the electronic device according to the embodiment of the invention.

FIG. 6 is a sectional diagram showing a mounting example of the electronic device according to the embodiment of the invention. The section of the electronic device 1 shown in FIG. 6 corresponds to the section of the electronic device 1 shown in FIG. 1. The electronic device 1 described hereinbefore may be mounted above a circuit board 50 having interconnections 56. In this case, the first electrodes 16 are mounted (horizontally disposed) above the circuit board 50 while facing the circuit board 50. The first electrodes 16 are connected to the interconnections 56 with a brazing material 58.

Figure 7:
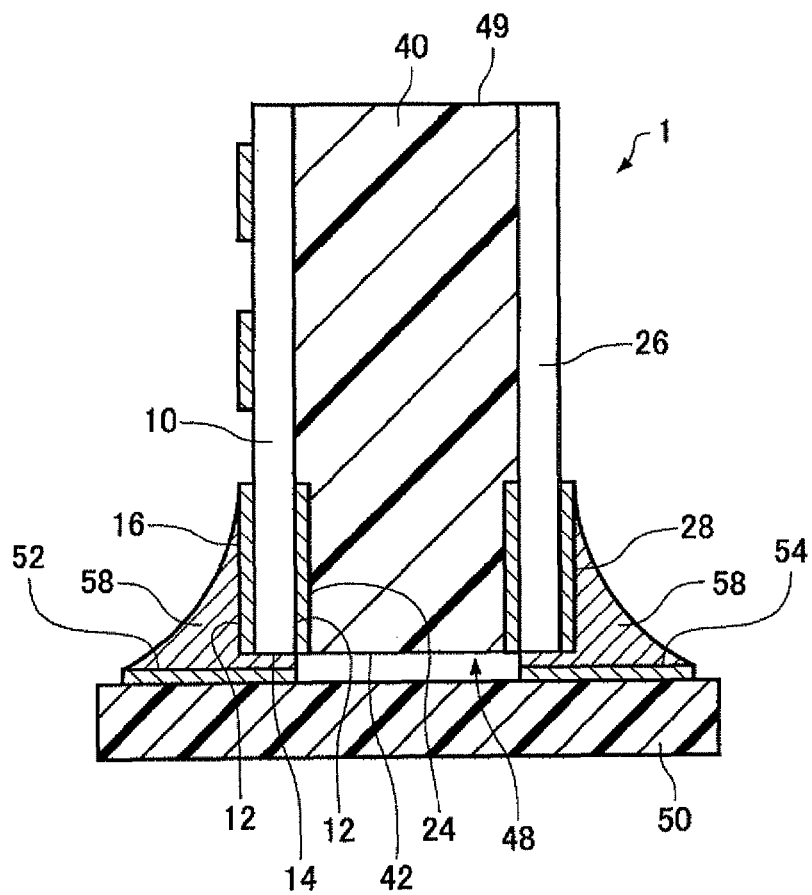
FIG. 7 is a sectional diagram of an electronic module according to one embodiment of the invention.

FIG. 7 is a sectional diagram of an electronic module according to one embodiment of the invention. The section of the electronic device 1 included in the electronic module shown in FIG. 7 corresponds to the section of the electronic device 1 shown in FIG. 2.

The electronic module includes the aforementioned electronic device 1 and the circuit board 50 having first and second interconnections 52, 54. The electronic device 1 may be mounted (disposed vertically) above the circuit board 50, with the mounting surface 48 facing the circuit board 50 and with the upper-end mounting surface 49 facing upward. In this case, if the upper-end mounting surface 49 is flat, a suction mounter can be used for mounting. The first and second electrodes 16, 28 are connected (and electrically coupled) to the respective first and second interconnections 52, 54 with the brazing material 58. Specifically, the side surface electrode portions 22 of the first and second electrodes 16, 28 face the respective first and second interconnections 52, 54, and are connected to the circuit board 50 of the electronic device 1 in a direction opposite from the direction of the electronic device 1 with respect to the circuit board 50 (e.g., the direction of gravitational force). The surface electrode portions 18 of the first and second electrodes 16, 28 are set upright above the respective first and second interconnections 52, 54. The exposed surface 42 of the resin 40 and the side surfaces 14 of the electrodes 16, 28 are supported so as not to move in a direction horizontal to the circuit board 50 of the electronic device 1 (e.g., in a direction orthogonal to the direction of gravitational force). This support is applied to both surfaces (the first and second surfaces 44, 46) of the electronic device 1, thereby providing a secure support. The effect of this support is further enhanced if the first and second electrodes 16, 28 are disposed plane-symmetrically to each other.

According to this embodiment, the first and second electrodes 16, 28 are provided on the first and second surfaces 44, 46 of the electronic device 1. Since these electrodes 16, 28 are adjacent to the mounting surface 48, the electrodes 16, 28 can be electrically coupled even if the electronic device 1 is disposed with the mounting surface 48 facing downward. Accordingly, by making the mounting surface 48 to face downward, it becomes possible to upwardly mount (vertically mount) the electric element 30 even if the electric element 30 is disposed (mounted horizontally) with its broadest surface facing the first and second substrates 10, 26.

FIGS. 8A through 8D are diagrams explaining a method for fabricating an electronic device 1 according to one embodiment of the invention.

Figure 8A:
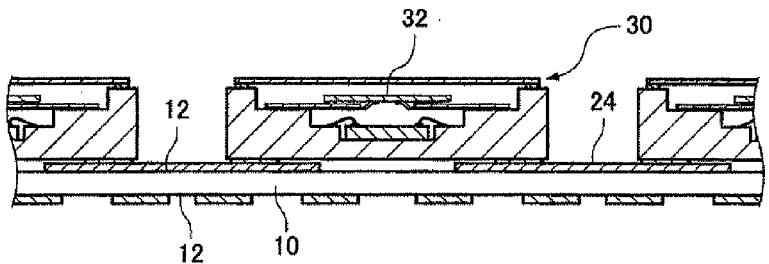
FIGS. 8A through 8D are diagrams explaining a method for fabricating an electronic device according to one embodiment of the invention.

Referring to FIG. 8A, the electric element 30 is mounted above the first substrate 10. The electric element 30 is disposed such that the broadest surface thereof faces the first substrate 10. The electric element 30 is electrically coupled to the first electrode 16.

Figure 8B:
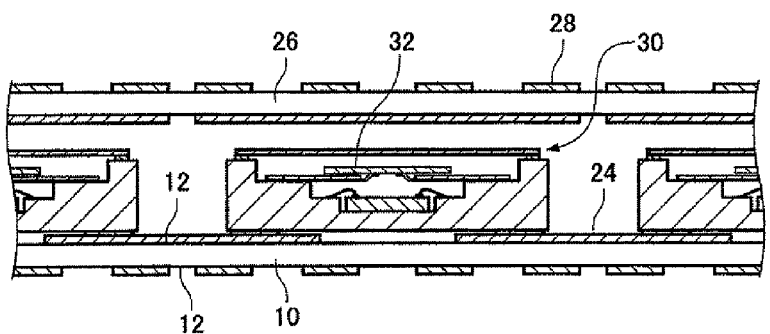

Referring to FIG. 8B, the second substrate 26 is disposed with a space above the first substrate 10 and the electric element 30. To provide the space, a spacer (not shown) may be disposed between the first and second substrates 10, 26.

Through the processes as described, the electric element 30 is disposed between the first substrate 10 having the first electrodes 16 and the second substrate 26 having the second electrodes 28, in such a manner that the broadest surface of the element 30 having the outline configuration of a polyhedron faces the first and second substrates 10, 26. The first electrode 16 is thereby electrically coupled to the electric element 30.

Figure 8C:
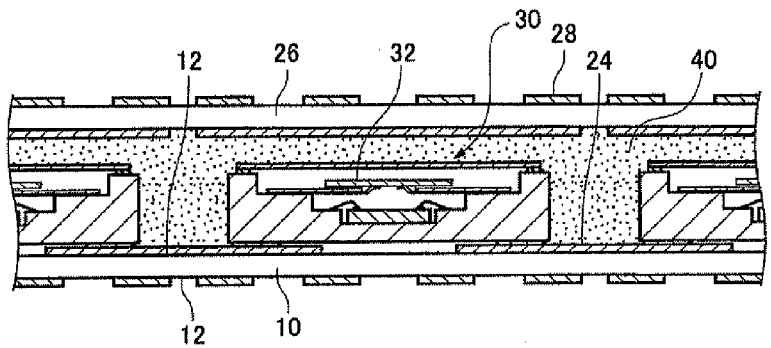

Referring to FIG. 8C, the electric element 30 is sealed between the first and second substrates 10, 26 with the resin 40 (technically, a resin precursor at this stage). For the sealing, transfer molding may be employed, or other sealing techniques may be employed.

Figure 8D:
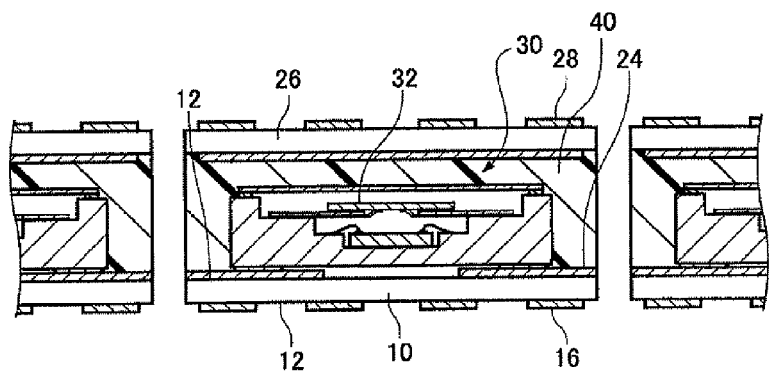

Referring to FIG. 8D, the first and second substrates 10, 26 as well as the resin 40 are diced in an integral fashion. A cutter such as a dicer may be used for dicing. The first substrate 10 is diced such that the first electrodes 16 are disposed on the first surface 44 adjacent to the mounting surface 48. The first and second substrates 10, 26 and the resin 40 are diced integrally such that the diced surface becomes flat and orthogonal to the two surfaces 12 of the first substrate 10 (or of the second substrate 26).

Through dicing, a plurality of electronic devices 1 are obtained in such a state that the diced surfaces of the adjacent electronic devices 1 face each other. The diced facing surfaces may be the mounting surface 48 and the upper-end mounting surface 49 (see FIGS. 3A through 3C), may both be the mounting surfaces 48, or may both be the upper-end mounting surfaces 49. Either way, if one diced facing surface is flat, the other diced facing surface also becomes flat.

Figure 9:
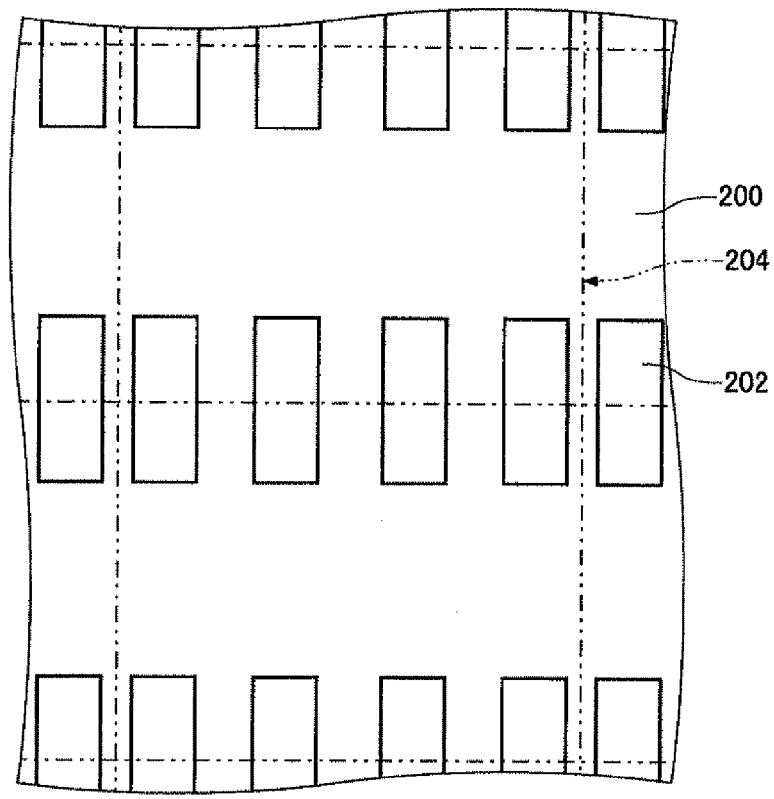
FIG. 9 is a diagram explaining a first alternative example of a dicing process.

FIG. 9 is a diagram explaining a first alternative example of the dicing process In this example, a plurality of electronic devices 204 are obtained by integrally dicing a first substrate 200, first electrodes 202, a second substrate (not shown), second electrodes (not shown), and a resin (not shown). In this case, because the first electrodes 202 and the second electrodes (not shown) are diced, these electrodes are provided up to the diced ends of these electrodes. Therefore, when the first electrodes 202 and the second electrodes are vertically mounted on lands of the circuit board with the mounting surface facing downward, the first electrodes 202 and the second electrodes come very close to the lands of the circuit board. Therefore, if the connection is conducted by soldering, for example, solders readily rise toward the first electrodes 202 and the second electrodes, making it convenient for mounting.

Figure 10:
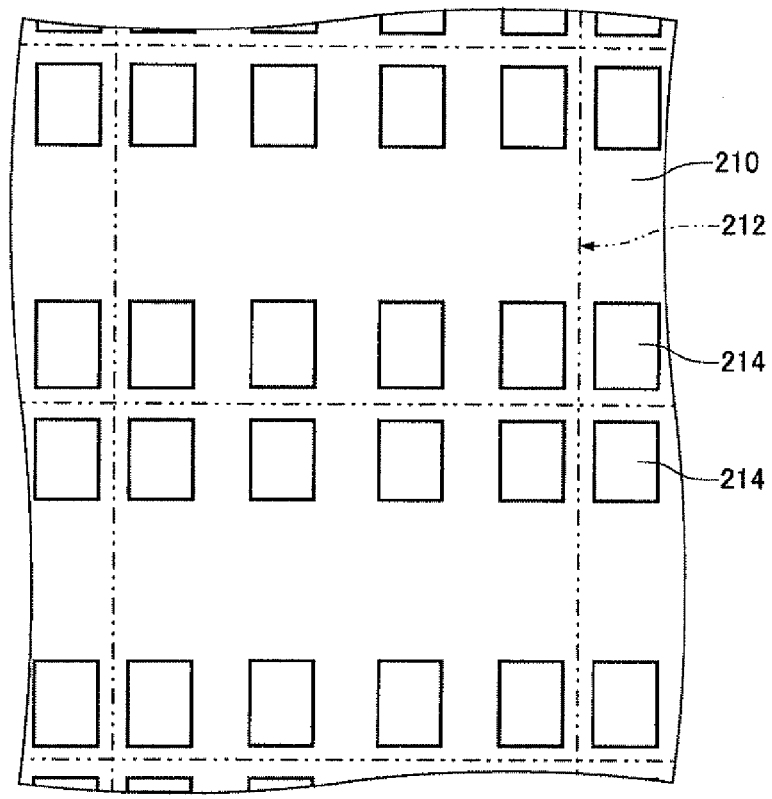
FIG. 10 is a diagram explaining a second alternative example of the dicing process.

FIG. 10 is a diagram explaining a second alternative example of the dicing process. In this example, a first substrate 210, a second substrate (not shown), and a resin (not shown) are diced integrally to produce a plurality of electronic devices 212. However, first electrodes 214 and second electrodes (not shown) are not diced. Thus, burrs do not occur to diced surfaces of the first electrodes 214 and the second electrodes (not shown).

The first surface 44 of the electronic device 1 is composed of the part of the surface of the first substrate 10 opposite from the surface on the side adjacent to the resin 40. The second surface 46 of the electronic device 1 is composed of the part of the surface of the second substrate 26 opposite from the surface on the side adjacent to the resin 40. The mounting surface 48 of the electronic device 1 is composed of the exposed surface 42 made as a result of dicing the resin 40 and the side surfaces 14 made as a result of dicing the first and second substrates 10, 26.

The method for fabricating the electronic device 1 according to the embodiment of the invention includes the aforementioned processes and may also employ methods apparent from the composition of the electronic device 1.

Figure 11:
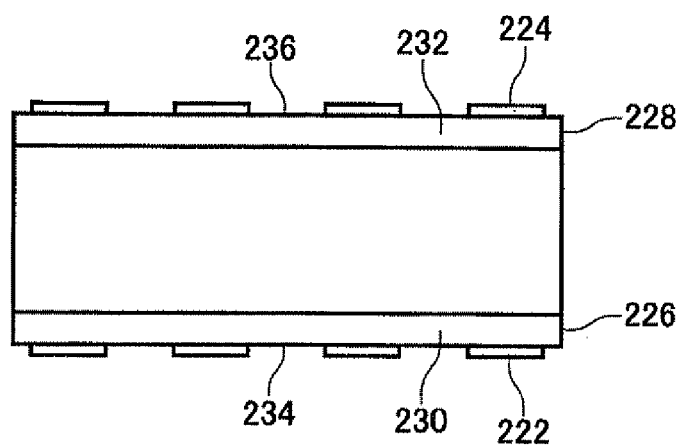
FIG. 11 is a side surface diagram of a first alternative example of the electronic device.

FIG. 11 is a side surface diagram of a first alternative example of the electronic device. The electronic device in this example does not include the side surface electrode portions 22 as those shown in FIG. 4. Specifically, first and second electrodes 222, 224 are disposed only on first and second surfaces 234, 236, avoiding side surfaces 230, 232 of first and second substrates 226, 228.

Figure 12A:
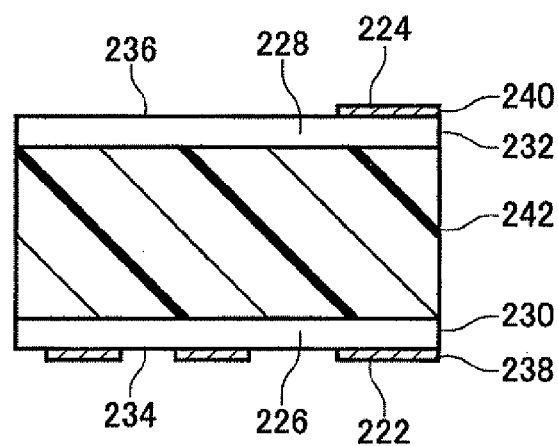
FIG. 12A is a sectional diagram of the electronic device illustrated in FIG. 11.

FIG. 12A is a sectional diagram of the electronic device illustrated in FIG. 11. In this example, side surfaces 238, 240 of respective the first and second electrodes 222, 224 share the same surface with the side surfaces 230, 232 of the respective first and second substrates 226, 228. Specifically, the first electrodes 222 are disposed on the first surface 234 adjacent to a mounting surface 242, and the second electrodes 224 are disposed on the second surface 236 adjacent to a mounting surface 242. This configuration is obtained through the dicing process shown in FIG. 9.

Figure 12B:
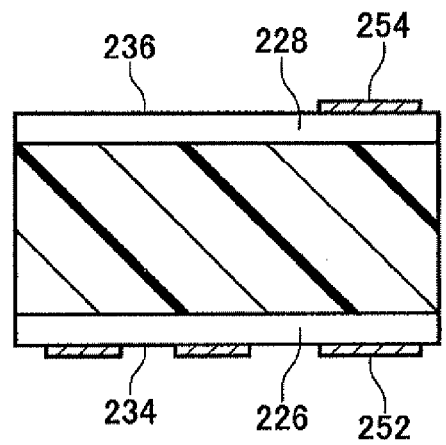
FIG. 12B is a sectional diagram of the alternative example of the electronic device illustrated in FIG. 11.

FIG. 12B is a sectional diagram of the alternative example of the electronic device illustrated in FIG. 11. In this example, first and second electrodes 252, 254 are disposed, with intervals therebetween, from ends of the respective first and second substrates 226, 228. Specifically, the first electrodes 252 are disposed, with intervals therebetween, from the periphery of the first surface 234, and the second electrodes 254 are disposed, with intervals therebetween, from the periphery of the first surface 236. This configuration is obtained through the dicing process shown in FIG. 10.

Figure 13A:
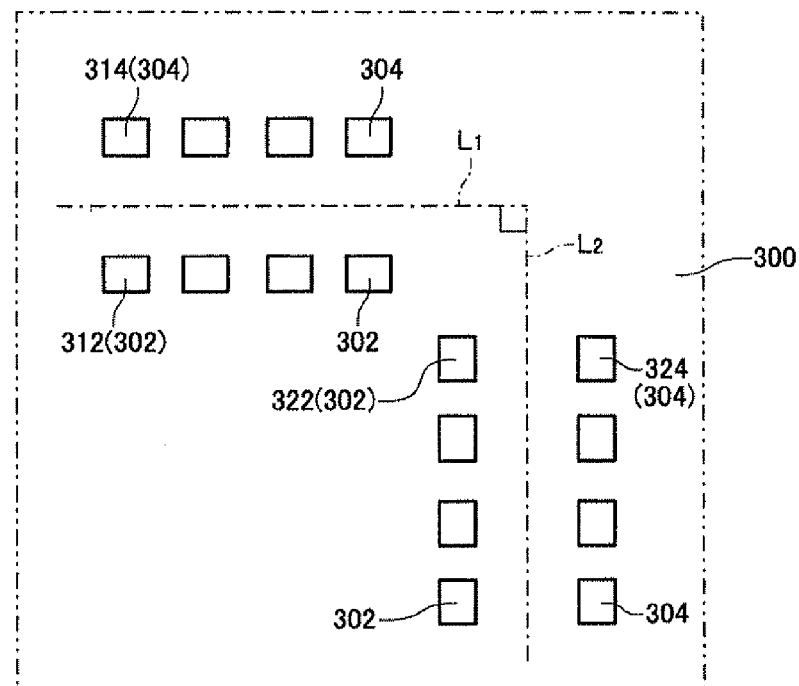
FIGS. 13A and 13B are diagrams explaining a method for fabricating an electronic module according to one embodiment of the invention.
Figure 13B:
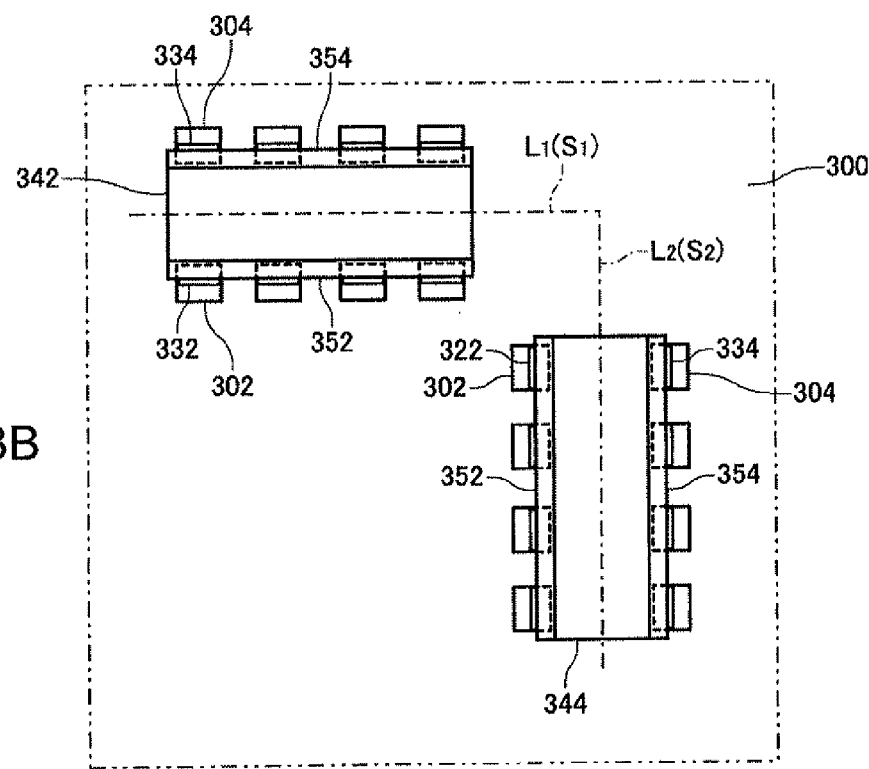

FIGS. 13A and 13B are diagrams explaining a method for fabricating the electronic module according to one embodiment of the invention.

Referring to FIG. 13A, prepared in this embodiment is a circuit board 300 having a plurality of first lands 302 and a plurality of second lands 304. The first lands 302 are aligned line-symmetrically (e.g., in parallel) to the second lands 304. Specifically, a first group of the plurality of first lands 312 and a first group of the plurality of second lands 314 are aligned line-symmetrically to each other with reference to a line $L_1$. A second group of the plurality of second lands 322 and a second group of the plurality of second lands 324 are aligned line-symmetrically to each other with reference to a line $L_2$. The lines $L_1$ and $L_2$ are orthogonally arranged.

With reference to FIG. 13B, prepared in this embodiment are a first electronic device 342 and a second electronic device 344 having, respectively, a plurality of first electrodes 332 and a plurality of second electrodes 334. In both the first and second electronic devices 342, 344, first surfaces 352 are in parallel to second surfaces 354. The plurality of first electrodes 332 are positioned plane-symmetrically to the plurality of second electrodes 334 using, as reference planes, planes (planes $S_1$, $S_2$ containing the lines $L_1$, $L_2$) located in parallel to and halfway between the first and second surfaces 352, 354. Also, the surfaces of the first and second electrodes 332, 334 have an identical configuration.

With reference to FIG. 13B, the first and second electronic devices 342, 344 are mounted on the circuit board 300, with their mounting surfaces (rear surfaces in the drawing) facing the circuit board 300. The plurality of first and second electrodes 332, 334 are coupled respectively to the plurality of first and second lands 302, 304 by braze-bonding. According to this embodiment, alignment of the first and second electronic devices 342, 344 against the circuit board 300 is made possible by utilizing a self-alignment effect exerted in braze-bonding. The self-alignment effect is enhanced if the first lands 302 and the first electrodes 332 have the same width in a direction of the line $L_1$, and if the second lands 304 and the second electrodes 334 have the same width in a direction of the line $L_2$.

Figure 14A:
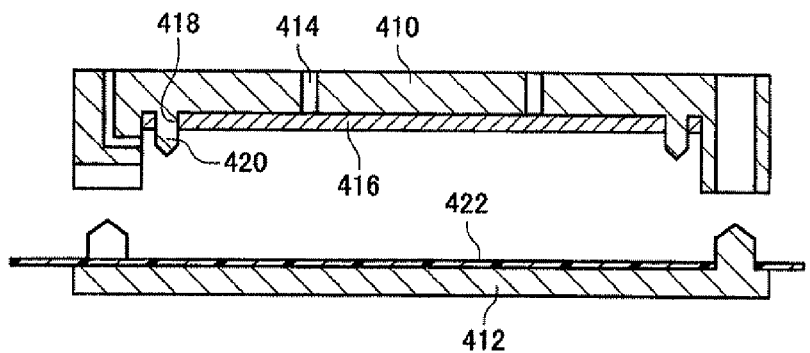
FIGS. 14A through 14D are diagrams explaining a first alternative example of the method for fabricating the electronic device according to the embodiments of the invention.
Figure 14B:
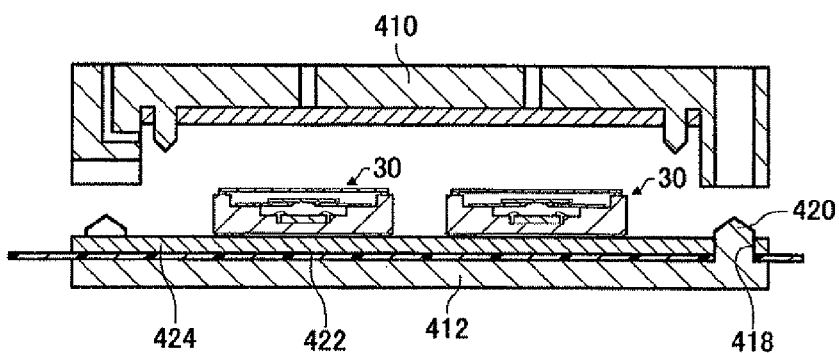
Figure 14C:
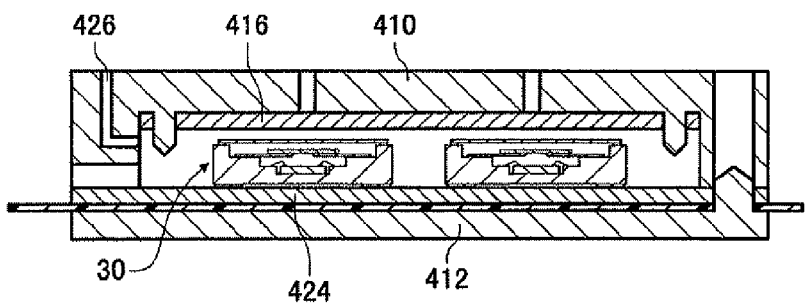
Figure 14D:
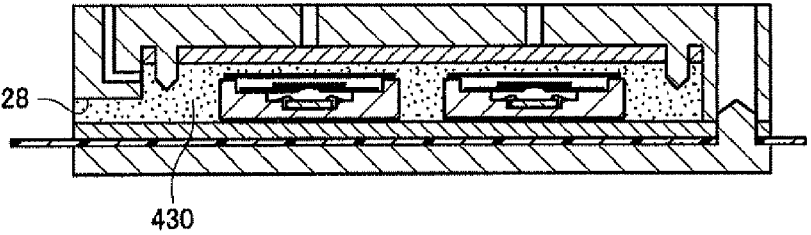
Figure 15A:
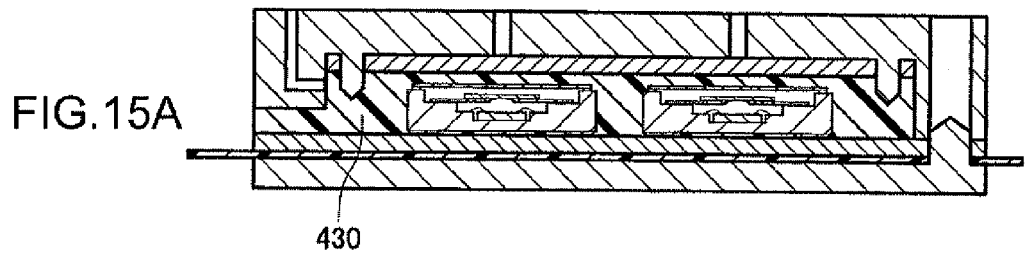
FIGS. 15A through 15E are diagrams explaining the first alternative example of the method of fabricating the electronic device according to the embodiments of the invention.
Figure 15B:
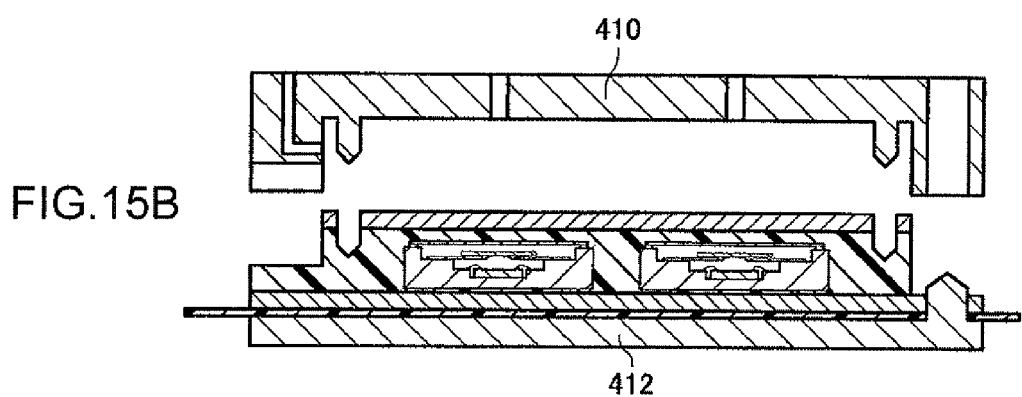
Figure 15C:
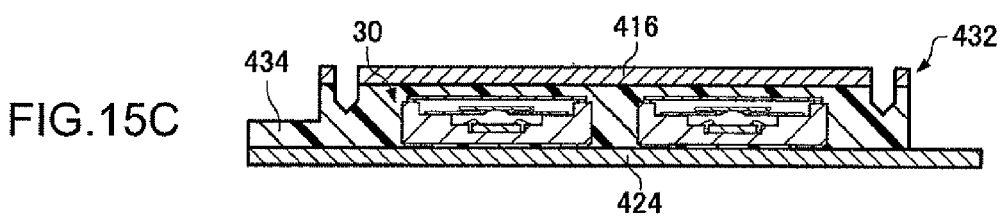
Figure 15D:
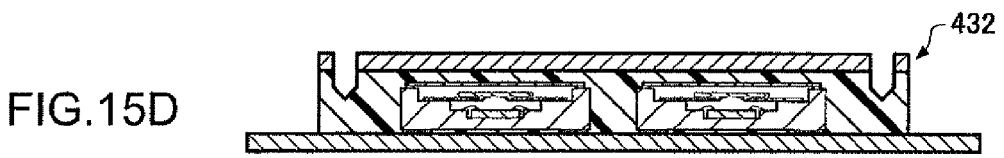
Figure 15E:
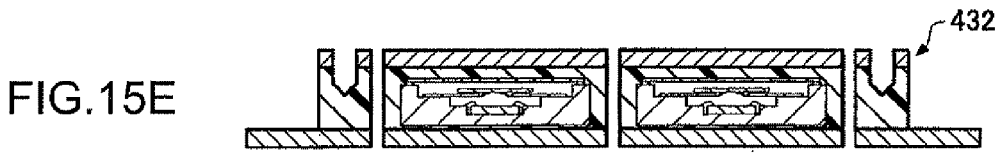

Described next is a first alternative example of the method for fabricating the electronic device according to the embodiments of the invention. In this example, with reference to FIG. 14A, an upper die 410 and a lower die 412 are used. A second substrate 416 is pulled to the upper die 410 by air suction through a suction port 414. A pin 420 of the upper die 410 is placed in a hole 418 of the second substrate 416 so as to position the second substrate 416. A release sheet 422 is disposed on the lower die 412. Referring to FIG. 14B, a first substrate 424 is disposed on the release sheet 422. The pin 420 of the lower die 412 is placed in the hole 418 of the first substrate 424 so as to position the first substrate 424. The plurality of electric elements 30 are arranged on the first substrate 424. Referring to FIG. 14C, the upper and lower dies 410, 412 are clamped such that the electric elements 30 are placed between the first and second substrates 424, 416, and a cavity is evacuated through an air hole 426. Referring to FIG. 14D, the cavity is filled with a mold resin 430 through an inlet 428, and the mold resin 430 is cured as shown in FIG. 15A. Referring to FIG. 15B, the upper and lower dies 410, 412 are opened, followed by taking out a sealing body 432 which seals the plurality of electrode elements 30 between the first and second substrates 424, 416, with reference to FIG. 15C. Referring to FIG. 15D, unnecessary resin portions 434 incorporated in the sealing body 432 are removed (subject to gate breaking or runner breaking). Thereafter, with reference to FIG. 15E, dicing is conducted. For other details, relevant descriptions of the aforementioned fabrication method will apply.

Figure 16A:
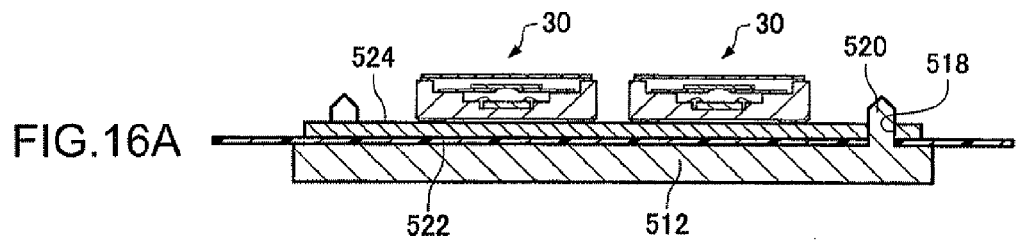
FIGS. 16A through 16D are diagrams explaining a second alternative example of the method for fabricating the electronic device according to the embodiments of the invention.
Figure 16B:
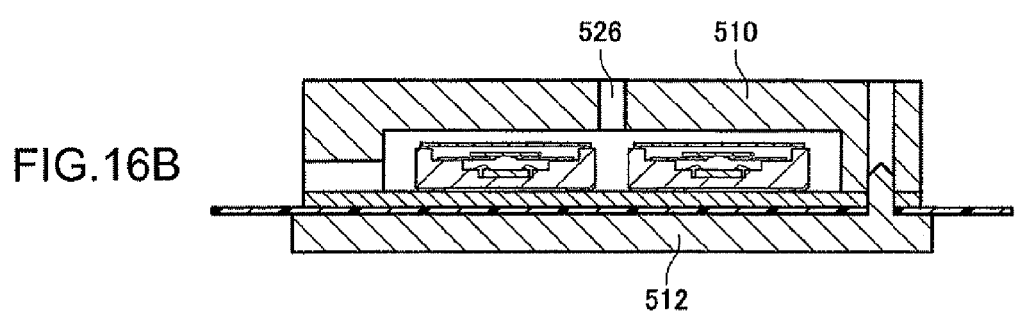
Figure 16C:
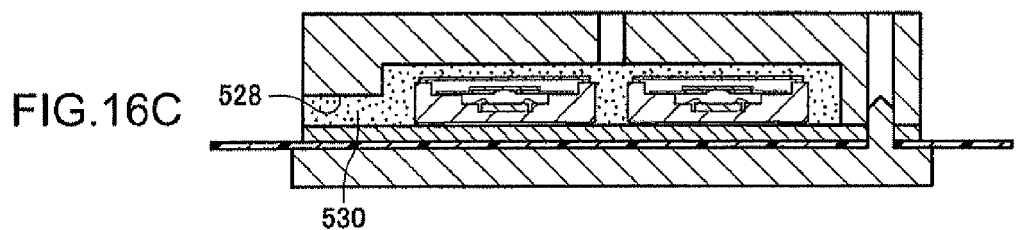
Figure 16D:
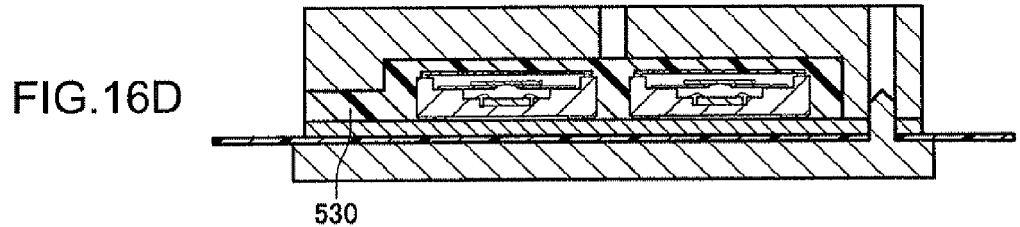
Figure 17A:
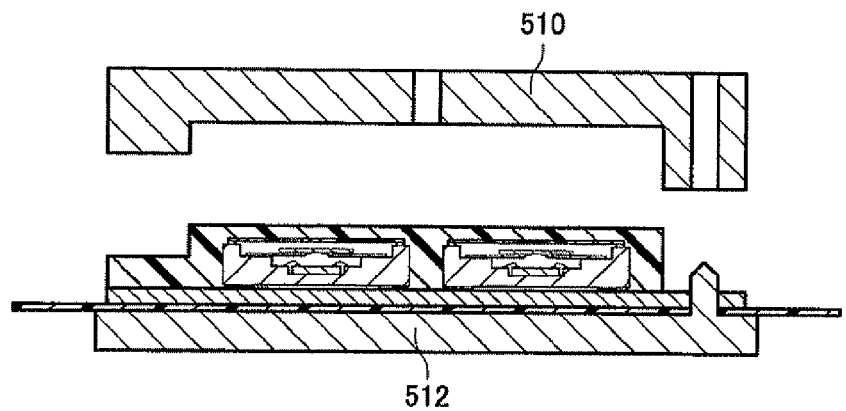
FIGS. 17A through 17D are diagrams explaining the second alternative example of the method for fabricating the electronic device according to the embodiments of the invention.
Figure 17B:
Figure 17C:
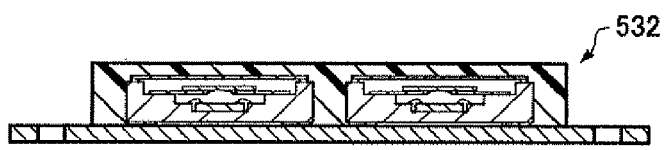
Figure 17D:
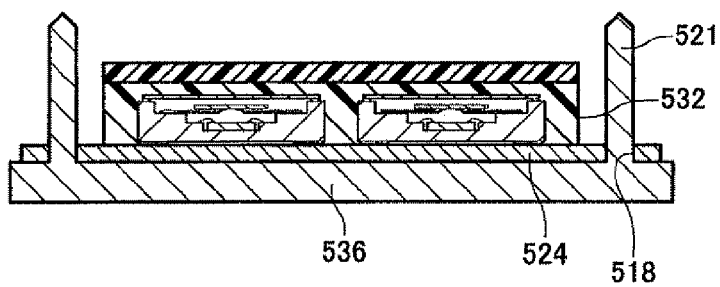
Figure 18A:
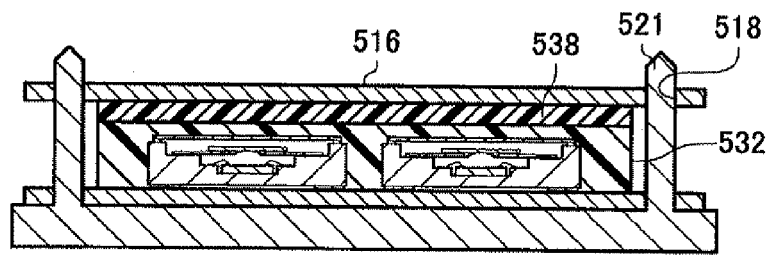
FIGS. 18A through 18D are diagrams explaining the second alternative example of the method for fabricating the electronic device according to the embodiments of the invention.
Figure 18B:
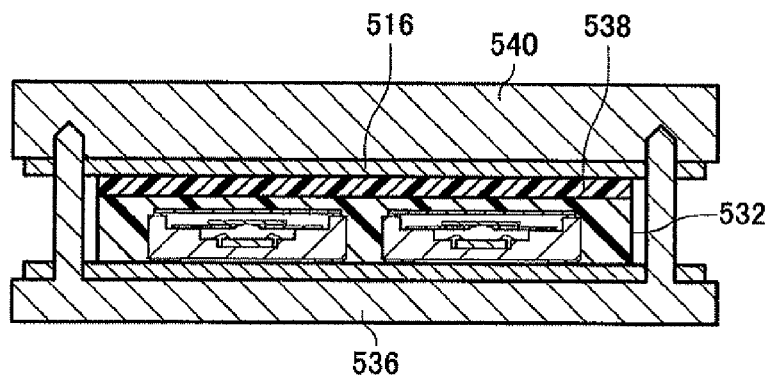
Figure 18C:
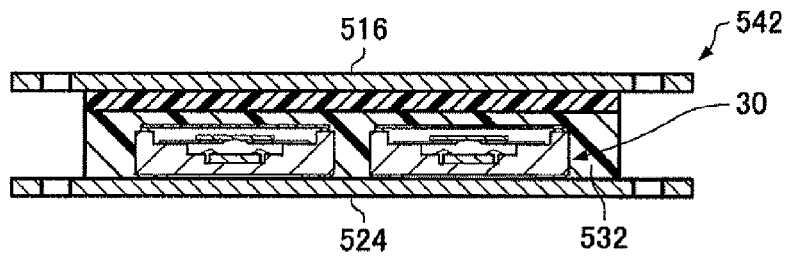
Figure 18D:
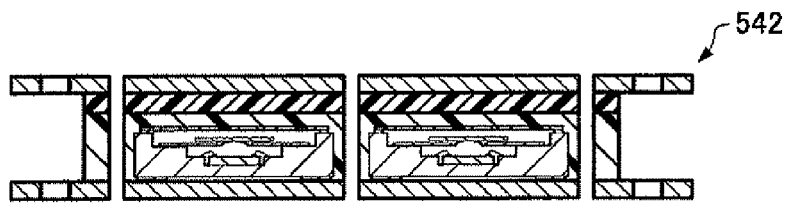

Described next is a second alternative example of the method for fabricating the electronic device according to the embodiments of the invention. In this example, with reference to FIG. 16A, a release sheet 522 is set on a lower die 512, and a first substrate 524 is set on the release sheet 522. A pin 520 of the lower die 512 is placed in a hole 518 of the first substrate 524 so as to position the first substrate 524. The plurality of electric elements 30 are disposed on the first substrate 524. Referring to FIG. 16B, an upper die 510 and the lower dies 512 are clamped, and a cavity is evacuated through an air hole 526. Referring to FIG. 16C, the cavity is filled with a mold resin 530 through an inlet 528, and the mold resin 530 is cured as shown in FIG. 16D. Referring to FIG. 17A, the upper and lower dies 510, 512 are opened, followed by taking out a sealing body 532 sealing the plurality of electrode elements 30, with reference to FIG. 17B. Referring to FIG. 17C, unnecessary resin portions 534 incorporated in the sealing body 532 are removed (subject to gate breaking or runner breaking). With reference to FIG. 17D, the sealing body 532 is set in a lower press die 536. A pin 521 of the lower press die 536 is placed in the hole 518 of the first substrate 524 which is part of the sealing body 532 so as to position the first substrate 524. Referring to FIG. 18A, a laminating sheet 538 is disposed on the sealing body 532. The laminating sheet 538 is, for example, a thermoplastic resin (e.g., epoxy resin) and may not have to exhibit adhesivity or viscosity when disposed on the sealing body 532. A second substrate 516 is disposed above the sealing body 532 with the laminating sheet 538 therebetween. The pin 521 of the lower press die 536 is placed in the hole 518 of the second substrate 516 so as to position the first substrate 516. Referring to FIG. 18B, using an upper press die 540 and the lower press die 536, pressure and heat are applied simultaneously between the second substrate 516 and the sealing body 532, with the laminating sheet 538 interposed therebetween. The laminating sheet 538 thereby exhibits adhesivity, thereby bonding the second substrate 516 to the sealing body 532 by thermal compression. Referring to FIG. 18C, an intermediary body 542 which seals the plurality of electric elements 30 between the first and second substrates 524, 516 is taken out and diced, with reference to FIG. 18D. For the rest of the details, relevant descriptions of the aforementioned fabrication method will apply.

The invention is not limited to the described embodiments, and various modifications are possible. For example, the invention includes compositions (e.g., compositions involving the same functions, methods, and results, or compositions having the same objectives and effects) that are substantially the same as those described in the embodiments. Also, the invention includes compositions in which non-essential elements of the structures described in the embodiments are substituted for other elements. Moreover, the invention includes compositions with which the same operational effects can be produced and the same objectives can be achieved as those with the compositions described in the embodiments. Furthermore, the invention includes compositions by known techniques in addition to the compositions as described in the embodiments.

What is claimed is:

1. An electronic device, comprising:
   an outline configuration including:
      a first surface;
      a second surface facing opposite from the first surface; and
      a mounting surface coupled to the first and second surfaces;
   a first substrate including a first electrode;
   a second substrate including a second electrode;
   a resin disposed between the first and second substrates; and
   an electric element sealed with the resin and having an outline configuration of a polyhedron, the electric element being disposed such that a broadest surface of the polyhedron faces one of the first substrate and the second substrate, wherein:
   the first surface is one surface of the first substrate, the one surface being opposite from another surface of the first substrate on a side adjacent to the resin;
   the second surface is one surface of the second substrate, the one surface being opposite from another surface of the second substrate on a side adjacent to the resin;
   the mounting surface includes:
      an exposed surface of the resin between the first and second substrates; and
      side surfaces of the first and second substrates adjacent to the exposed surface;
   the first electrode is disposed at an end of the first surface adjacent to the mounting surface and electrically coupled to the electric element; and
   the second electrode is disposed at an end of the second surface adjacent to the mounting surface and electrically coupled to the electric element.

2. The electronic device according to claim 1, wherein each of the first and second electrodes includes a portion constituting part of the mounting surface.

3. The electronic device according to claim 1, wherein:
   the first electrode is disposed from a periphery of the first surface with an interval; and
   the second electrode is disposed from a periphery of the second surface with an interval.

4. The electronic device according to claim 1, wherein:
   the first electrode is disposed on the first surface adjacent to the mounting surface; and
   the second electrode is disposed on the second surface adjacent to the mounting surface.

5. The electronic device according to claim 4, wherein each of the first and second electrodes includes a side surface electrode portion reaching to the side surface of each of the respective first and second substrates.

6. The electronic device according to claim 1, wherein:
   the first and second electrodes are disposed only on the respective first and second surfaces while avoiding the side surface of the respective first and second substrates.

7. The electronic device according to claim 1, wherein:
   the first and second surfaces are in parallel with each other; and
   the first and second electrodes are positioned plane-symmetrically to each other using, as a reference plane, a plane located in parallel to and halfway between the first and second surfaces.

8. The electronic device according to claim 1, wherein the first and second electrodes have an identical surface configuration.

9. The electronic device according to claim 1, wherein the second electrode is electrically insulated from the electric element.

10. The electronic device according to claim 1, wherein the second electrode is electrically coupled to the electric element.

11. The electronic device according to claim 1, wherein the electric element is an inertial sensor element.

12. An electronic module, comprising:
    the electronic device according to claim 1; and
    a circuit board including a first interconnection and a second interconnection, wherein:
    the electronic device is mounted above the circuit board with the mounting surface facing the circuit board; and
    the first and second electrodes are connected to the respective first and second interconnections by a brazing material.

13. A method for fabricating an electronic module, comprising:
    (a) preparing the electronic device according to claim 1, the electronic device including a plurality of the first electrodes and a plurality of the second electrodes;
    (b) preparing a circuit board including a plurality of first lands and a plurality of second lands;
    (c) mounting the electronic device above the mounting surface with the mounting surface facing the circuit board and bonding the plurality of first and second electrodes to the plurality of respective first and second lands using a brazing material, wherein:
    the first and second surfaces of the electronic device are in parallel with each other, and the plurality of first and second electrodes are positioned plane-symmetrically to each other using, as a reference plane, a plane located in parallel to and halfway between the first and second surfaces;

the plurality of first and second lands are aligned line-symmetrically to each other; and the electronic device is positioned against the circuit board utilizing a self-alignment effect exerted in the braze-bonding in step (c).

14. A method for fabricating an electronic device which includes an outline configuration having a first surface, a second surface facing opposite from the first surface, and a mounting surface coupled to the first and second surfaces, the method comprising:

(a) disposing an electric element having an outline configuration of a polyhedron between a first substrate having a first electrode and a second substrate having a second electrode, in a manner that a broadest surface of the polyhedron faces one of the first substrate and the second substrate and electrically couples the first electrode to the electric element;

(b) sealing the electric element between the first and second substrates with a resin; and (c) dicing the first and second substrates and the resin integrally such that the diced surface becomes flat, wherein:

the first surface is made of a part of one surface of the first substrate, the one surface being opposite from another surface of the first substrate on a side adjacent to the resin;

the second surface is made of a part of one surface of the second substrate, the one surface being opposite from another surface of the second substrate on a side adjacent to the resin;

the mounting surface is composed of an exposed surface of the resin made as a result of dicing the resin and side surfaces of the first and second substrates made as a result of dicing the first and second substrates;

the first substrate is diced such that the first electrode is disposed on an end of the first surface adjacent to the mounting surface; and the second substrate is diced such that the second electrode is disposed on an end of the second surface adjacent to the mounting surface.

15. The method for fabricating an electronic device according to claim 14, wherein:

the first substrate is diced at a position at which the first electrode is diced, so that the first electrode is disposed on the first surface adjacent to the mounting surface; and the second substrate is diced at a position at which the second electrode is diced, so that the second electrode is disposed on the second surface adjacent to the mounting surface.

16. The method for fabricating an electronic device according to claim 14, wherein:

the first substrate is diced while avoiding the first electrode so that the first electrode is disposed from a periphery of the first surface with an interval; and the second substrate is diced while avoiding the second electrode so that the second electrode is disposed from a periphery of the second surface with an interval.

* * * * *